United States Patent
Hammer et al.

(10) Patent No.: US 7,137,865 B2
(45) Date of Patent: Nov. 21, 2006

(54) METHOD AND DEVICE FOR CUTTING SINGLE CRYSTALS, IN ADDITION TO AN ADJUSTING DEVICE AND A TEST METHOD FOR DETERMINING A CRYSTAL ORIENTATION

(75) Inventors: Ralf Hammer, Freiberg (DE); André Kleinwechter, Freiberg (DE); Tilo Flade, Freiberg (DE); Cornelia Kumann, Oberschöna (DE); Ralf Gruszynsky, Brand-Erbisdorf (DE)

(73) Assignee: Freiberger Compound Materials GmbH, Freiberg (DE)

( * ) Notice: Subject to any disclaimer, the term of this patent is extended or adjusted under 35 U.S.C. 154(b) by 177 days.

(21) Appl. No.: 10/399,672

(22) PCT Filed: Jul. 30, 2001

(86) PCT No.: PCT/EP01/08800

§ 371 (c)(1),
(2), (4) Date: Apr. 18, 2003

(87) PCT Pub. No.: WO02/34973

PCT Pub. Date: May 2, 2002

(65) Prior Publication Data

US 2004/0118338 A1  Jun. 24, 2004

(30) Foreign Application Priority Data

Oct. 20, 2000 (DE) ................................. 100 52 154

(51) Int. Cl.
*B24B 49/00* (2006.01)
*B24B 51/00* (2006.01)
*B28D 1/04* (2006.01)
*B28D 1/08* (2006.01)

(52) U.S. Cl. .................... 451/5; 125/13.01; 125/21; 125/901

(58) Field of Classification Search ............. 125/13.01, 125/21, 901
See application file for complete search history.

(56) References Cited

U.S. PATENT DOCUMENTS

| 4,844,047 | A |   | 7/1989 | Brehm et al. |
| 5,030,910 | A | * | 7/1991 | Junge et al. ............ 324/207.15 |
| 5,052,366 | A | * | 10/1991 | Matsukura ............... 125/16.01 |
| 5,131,975 | A | * | 7/1992 | Bourret-Courchesne ..... 117/82 |

(Continued)

FOREIGN PATENT DOCUMENTS

CH    690 422 A5    9/2000

(Continued)

*Primary Examiner*—Joseph J. Hail, III
*Assistant Examiner*—Bryan R. Muller
(74) *Attorney, Agent, or Firm*—George W. Neuner; Edwards Angell Palmer & Dodge LLP

(57) ABSTRACT

A method for the division of single crystals, in particular of GaAs, is provided in which a single crystal (1) to be cut into at least two parts and a cutting tool (2, 3; 8, 8a, 8b, 8c) are moved relative to one another in a direction of advancement (V) and wherein the single crystal (1) is oriented in such a way that a specified crystallographic orientation (K) lies in the cutting plane (T), characterized in that an angle (ρ) between the specified crystallographic direction (K) and the direction of advancement (V) is chosen in such a way that forces which act on the cutting tool during cutting in a direction at right angles to the cutting plane compensate one another.

9 Claims, 6 Drawing Sheets

U.S. PATENT DOCUMENTS

| | | | |
|---|---|---|---|
| 5,720,271 A * | 2/1998 | Hauser | 125/28 |
| 5,735,258 A * | 4/1998 | Okuno et al. | 125/16.02 |
| 5,839,424 A | 11/1998 | Hauser | 125/16.02 |
| 5,878,737 A | 3/1999 | Hodsden | 125/16.02 |
| 5,893,308 A * | 4/1999 | Katamachi et al. | 83/13 |
| 5,904,136 A | 5/1999 | Nagatsuka et al. | 125/16.02 |
| 5,913,305 A * | 6/1999 | Hauser | 125/16.02 |
| 6,112,737 A * | 9/2000 | Kinutani et al. | 125/16.02 |
| 6,159,284 A * | 12/2000 | Olkrug et al. | 117/28 |

FOREIGN PATENT DOCUMENTS

| | | |
|---|---|---|
| DE | 38 26 698 A1 | 2/1990 |
| EP | 0 269 997 | 6/1988 |
| GB | 628508 | 8/1949 |
| JP | 09-017755 | 1/1997 |
| JP | 09017755 A | 1/1997 |
| JP | 11074234 | 3/1999 |
| JP | 11074234 A * | 3/1999 |

* cited by examiner

METHOD AND DEVICE FOR CUTTING SINGLE CRYSTALS, IN ADDITION TO AN ADJUSTING DEVICE AND A TEST METHOD FOR DETERMINING A CRYSTAL ORIENTATION

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION (1) Field of the Invention

The invention relates to a method and a device for the division of single crystals, an adjusting device and a test method for the determination of an orientation of a single crystal for such a method.

(2) Description of Related Art

Single crystals produced by crystal pulling are divided into individual disks known as wafers for use in semiconductor technology. Known cutting methods are inner hole sawing and wire cutting. The cutting forces occurring in the division of single crystals result in lateral deflection of the rotary cutting disk in the case of inner hole sawing or of the wire in the case of wire cutting. As a result of this wafers of nonuniform thickness are produced or the surface exhibits other irregularities, e.g., warp and bow. In the case of silicon single crystals the predominant problem occurring is corrugation of the surface. This results in a reduction in quality in the wafers produced and hence in a lower yield of high-quality wafers.

To solve this problem it is known in the case of inner hole sawing to measure the deflection of the cutting disk and to correct this by the action of compressed air. This method, however, has the disadvantage that a film of coolant applied for cooling the cutting disk is affected by the compressed air and this in turn has an effect on cooling during cutting. It is, furthermore, known to set the single crystal in a mounting which is specially shaped in order to counteract the forces occurring in the deflection of the cutting disk with opposing forces for compensation. In wire cutting no active influence on the deflection of the wire is possible.

SUMMARY OF THE INVENTION

The aim of the invention is to provide a method and a device for the division of single crystals, an adjusting device and a test method for the determination of an orientation of a single crystal for such a method with which the aforesaid problems are avoided.

The present invention proves a method for the division of single-crystal materials, wherein a single crystal (1) to be cut into at least two parts and a cutting tool (2, 3; 8, 8a, 8b, 8c) are moved relative to one another in a direction of advancement (V), and wherein the single crystal (1) is oriented in such a way that a specified crystallographic orientation (K) lies in the cutting plane (T), characterised in that an angle (ρ) between the specified crystallographic direction (K) and the direction of advancement (V) is chosen in such a way that forces acting on the cutting tool during cutting in a direction at right angles to the cutting plane (T) compensate one another or add up to a predetermined force.

The invention also provides a device for adjustment a single crystal, wherein the single crystal (1) is of substantially cylindrical construction with a central longitudinal axis (M) and wherein the single crystal has a flat outer face section (4) and a certain crystallographic orientation (K) of the single crystal has a known angle (α) to the normal (N) to the flat outer face section in a plane at right angles to the central longitudinal axis (M), having a limit stop provided on a vertically oriented support (51) with a lower edge (54) which encloses a predetermined angle (γ) with the vertical.

In addition, the invention provides a test method for the determination of the optimum angle between the specified crystallographic orientation (K) and the direction of advancement (V) of the method for the division of single-crystal materials, as described herein, having the steps

- division of a single crystal, the single crystal being of substantially cylindrical construction with a central longitudinal axis (M) and the single crystal having an external characteristic (4) whose orientation relative to a specified crystallographic orientation (K) of the single crystal is known, into a plurality of sections (20a to 20e) of predetermined thickness at right angles to the central longitudinal axis,
- joining of the sections in such a way that the external characteristic of each section assumes a different azimuthal position relative to the central longitudinal axis,
- simultaneous cutting of the single crystal (20) assembled in this way in a cutting device into disks having the thickness of a wafer to be produced later,
- measurement of the surface evenness and/or thickness of the disks produced in this way,
- determination of the optimum angle (ρ) of the specified crystallographic orientation (K) relative to a direction of advancement (V) of a cutting tool.

Additional features of embodiments of the invention include:

(A) a method for the division of single-crystal materials having one or more of the following:
  (1) a deflection (X) of the cutting tool (2, 3; 8, 8a, 8b, 8c) during cutting is measured and the single crystal (1) is turned as a function of the measured value with the specified crystallographic orientation (K) in the cutting plane (T);
  (2) the cutting is done by means of inner hole sawing;
  (3) the cutting is done by means of wire cutting;
  (4) the angle (ρ) is determined empirically prior to cutting;
  (5) the setting of the angle (ρ) is done by means of an adjusting device outside the actual cutting device; and/or
  (6) the method is used for cutting single crystals (1) of the III-V semiconductors, in particular GaAs;

(B) a device for adjustment a single crystal having one or more of the following:
  (1) a measuring device (6) for the measurement of a deflection (X) of the cutting tool in a direction at right angles to the direction of advancement (V);
  (2) a control device, which is connected to the measuring device (6) and the turning device (5), and which controls the turning device (5) in such a way that the single crystal is turned so that the deflection of the cutting tool is substantially 0 or attains a predetermined value;
  (3) the device is an inner hole sawing device;
  (4) the device is a wire cutting device;
  (5) the single crystal (1) is of substantially cylindrical construction with a central longitudinal axis (M) and wherein the single crystal has a flat outer face section (4) and a certain crystallographic orientation (K) of the single crystal has a known angle ($\alpha$) to the normal (N) to the flat outer face section in a plane at right angles to the central longitudinal axis (M), having a limit stop provided on a vertically oriented support (51) with a lower edge (54) which encloses a predetermined angle ($\gamma$) with the vertical;
  (6) the limit stop is height-adjustable;
  (7) different exchangeable limit stops having different angles ($\gamma$) are provided; and/or
  (8) the device is an adjusting device for carrying out the method for the division of single-crystal materials, as described herein; and
(C) a test method having the feature that external characteristic is a flat or a notch.

The method and the device have the advantage that the quality of the wafers is increased and that during cutting higher rates of advancement are permitted. As a result inner hole sawing can be used in particular for GaAs, even for wafers six inches in diameter and possibly larger. Due to the improved quality of the wafers produced, otherwise usual post-machining steps can largely be dispensed with.

Other characteristics and practical features of the invention emerge from the description of exemplified embodiments with reference to the figures.

DETAILED DESCRIPTION OF THE INVENTION

Figure 1:
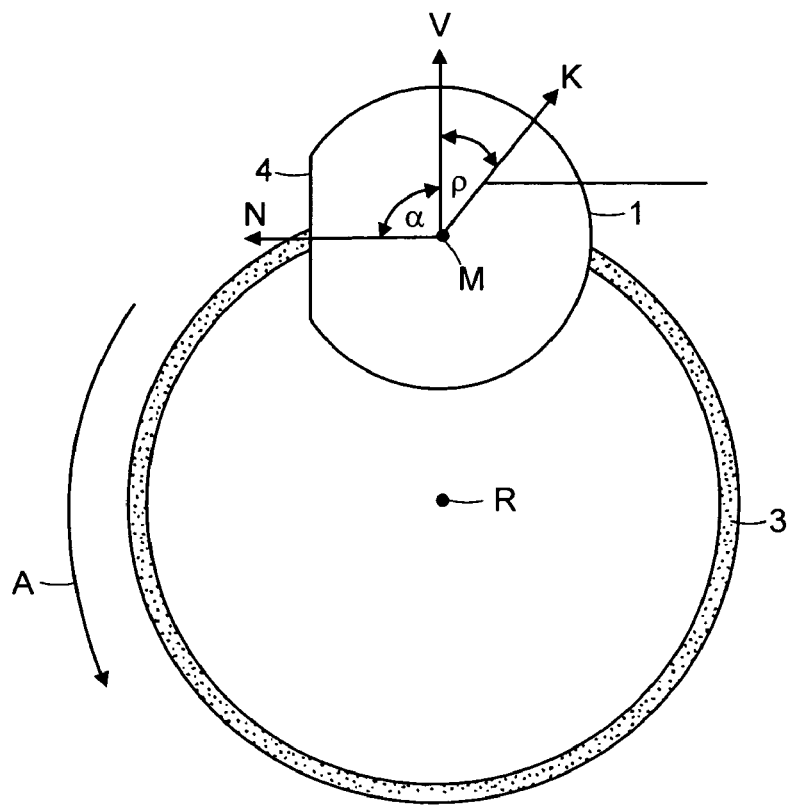
FIG. 1 a schematic illustration in plan view of a device for inner hole sawing in the direction of the central longitudinal axis of the single crystal.
Figure 2:
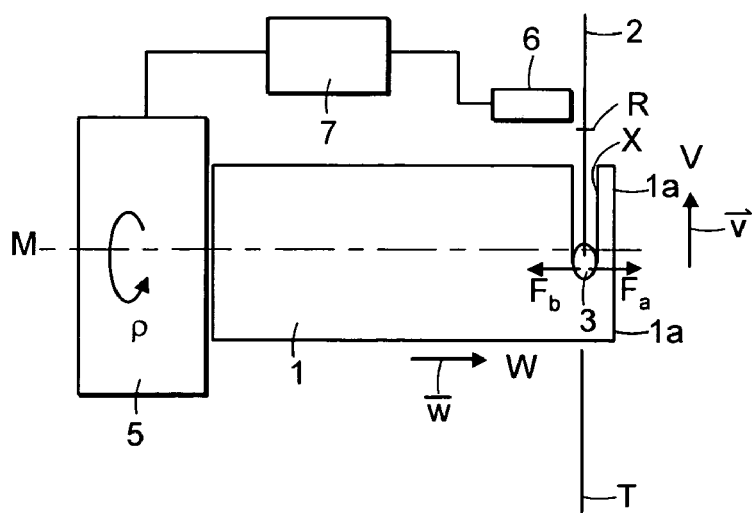
FIG. 2 a schematic side elevation of a device for inner hole sawing according to an embodiment of the invention.

As can be seen in FIGS. 1 and 2 a device according to the invention according to a first embodiment of the invention has an inner hole saw device. A single crystal 1 of substantially cylindrical shape having a central longitudinal axis M is held by a mounting which is not shown. An inner hole cutting disk 2, which in known manner is composed of a metal disk having a concentric hole on whose boundary a cutting edge 3 is formed by the application of diamond particles, is mounted rotatably about an axis of rotation R relative to the single crystal in such a way that the central longitudinal axis M of the single crystal and the axis of rotation R of the cutting disk run parallel to one another. A drive, which is not shown, is provided with which the cutting disk 2 can be rotated at a defined speed about the axis of rotation R in the direction A shown in FIG. 1. The single crystal 1 is movable via a drive of a feed unit in the direction of advancement V shown in FIG. 2 in the direction of the cutting disk 2 in such a way that the cutting disk 2 can completely cut through the single crystal 1 in a plane at right angles to its central longitudinal axis M. In addition a drive is provided for moving the single crystal 1 at right angles to the cutting disk 2 or along the direction of its central longitudinal axis at a speed w.

As can be seen in particular in FIG. 1 the single crystal 1 is not quite cylindrical but rather has a flat outer face section 4, which is referred to as the flat, which after pulling of the single crystal 1 has been fitted in defined manner in such a way that an angle $\alpha$, which a certain crystallographic orientation K, for example a [011] orientation for GaAs, and the normal N to the flat outer face section 4 subtend in a plane at right angles to the central longitudinal axis M, is known. Since the angle $\alpha$ is known, an angle $\rho$ between the specified crystallographic orientation K and the direction of advancement V of the single crystal in a plane at right angles to the central longitudinal axis M of the single crystal and hence in the cutting plane T is, therefore, also known. It should be noted that instead of the flat, an incision called a notch may also be provided on the outside of the single crystal. The only decisive factor is that there is an external characteristic whose arrangement relative to the specified crystallographic orientation is known.

Furthermore, as shown in FIG. 2, at the end of the single crystal 1 facing away from the cutting disk 2 the device possesses a device 5 for turning the single crystal 1 about its central longitudinal axis M. In addition a sensor 6 is provided for measuring any deflection x of the cutting disk 2 out of the cutting plane T during the cutting of a disk-shaped section 1a from the single crystal 1 which will later form the wafer. The sensor 6 and the device 5 for turning the single crystal 1 are connected to one another via a control device 7 which is constructed in such a way that depending on the measured deflection x of the cutting disk 2 the turning device 5 is actuated so that the single crystal 1 is turned into a specified azimuth position so that the specified crystallographic orientation K assumes a predefined angle ρ corresponding to the measured deflection x of the cutting disk 2 to the direction of advancement V.

Figure 3:
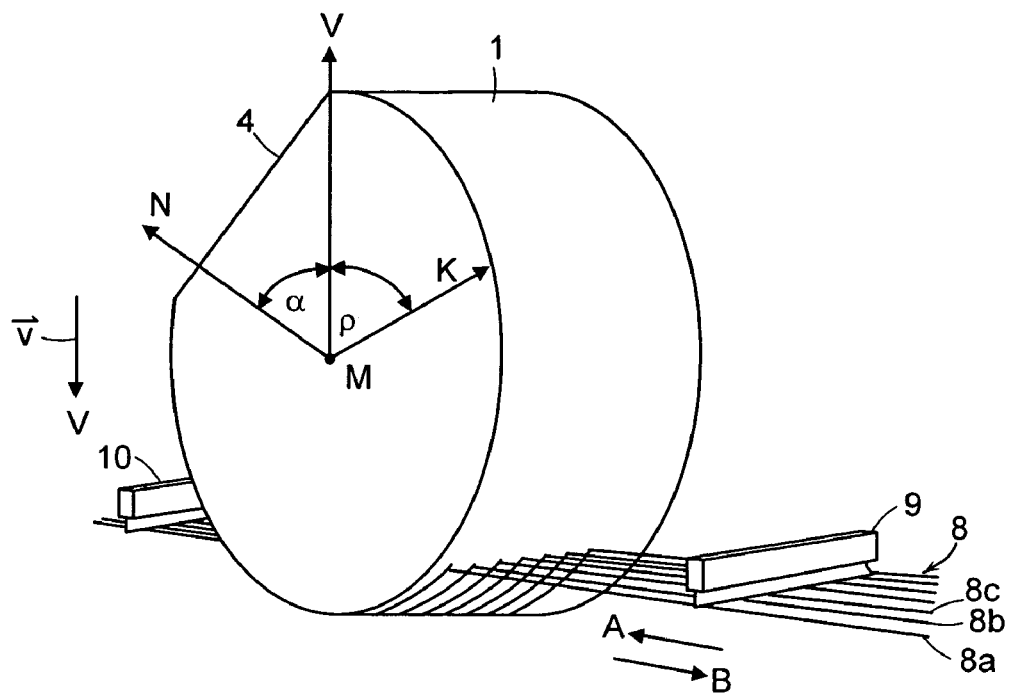
FIG. 3 a schematic illustration of a device for wire cutting in perspective view.
Figure 4:
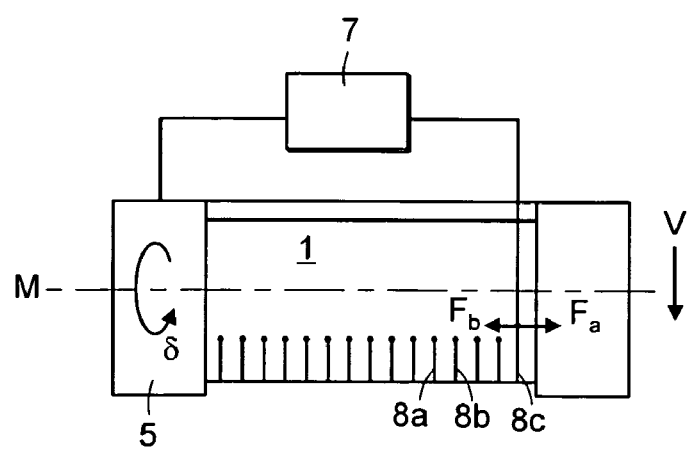
FIG. 4 a schematic illustration of a device for wire cutting in accordance with an embodiment of the invention in side elevation.
Figure 5:
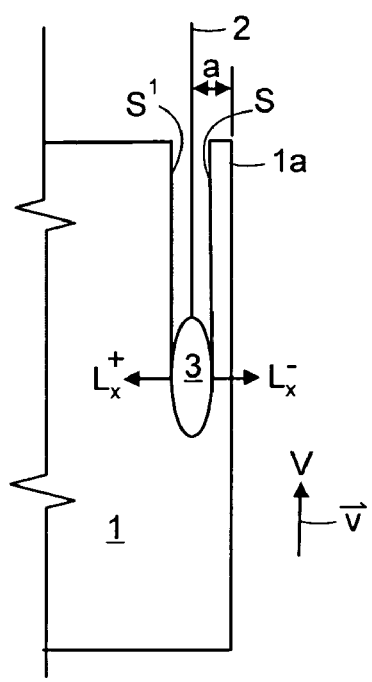
FIG. 5 a schematic illustration in side elevation of a wafer during inner hole sawing.

In a modified embodiment the device for cutting a single crystal is a wire cutting device as shown in FIGS. 3 and 4. Parts corresponding to the device shown in FIGS. 1 and 2 are labelled with the same reference symbols. As shown in FIG. 3 the single crystal 1 is held in a mounting which is not shown and is movable back and forth onto the wire field of a wire cutter 8 via a drive of a feed unit. The wire cutter 8 consists of a large number of wires 8a, 8b, 8c running in parallel which are stretched over rollers (not shown) and are movable in planes at right angles to the central longitudinal axis M of the single crystal 1 in the directions A and B shown by arrows. The device further comprises a device 9 for applying a paste containing diamond particles onto the wires 8a, 8b, 8c on one side of the single crystal 1 and a device 10 for cleaning the wires after passing through the single crystal and for removing the material abraded by the wires passing through the single crystal. Alternatively, the diamond particles are already firmly incorporated in the wire and application by means of a paste is not necessary. By analogy with the device illustrated in FIG. 2 this embodiment as illustrated in FIG. 4 likewise possesses a device 5 for turning the single crystal 1 and a sensor which detects the deflection of a wire 8a, 8b or 8c and a control device 7 for controlling the device 5 for turning the single crystal 1 as a function of the detected deflection of the wire.

The operation of the device according to FIGS. 1 and 2 is now described in what follows with reference to FIGS. 5 to 10.

Figure 6:
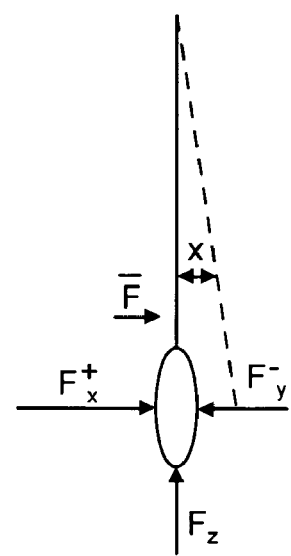
FIG. 6 an illustration of the forces occurring during inner hole sawing.
Figure 7:
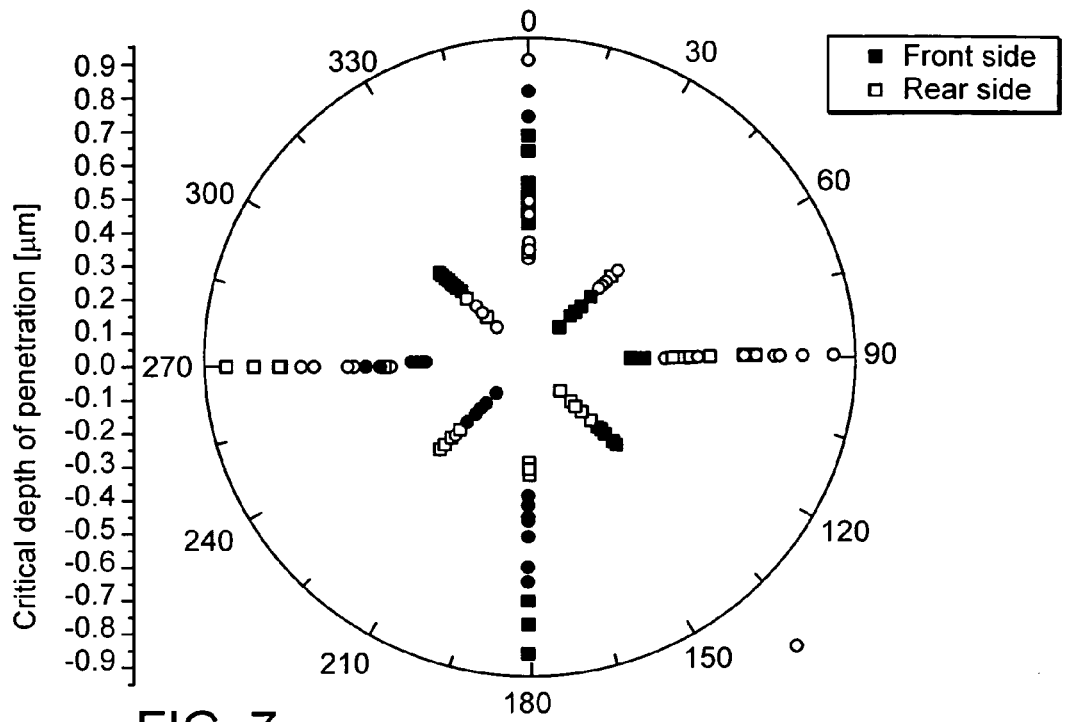
FIG. 7 an illustration of critical penetration depths for the reticulation of microcracks as a function of a direction of advancement of a cutting tool during cutting of a GaAs single crystal.

After fitting the single crystal 1 in the mounting, the mounting is pushed forward by the drive in the direction W shown in FIG. 2 in such a way that there is a distance a between the free end 1a of the single crystal and the cutting disk 2 which is a little more than the thickness of a wafer to be produced. The single crystal 1 is then moved via the drive in the feed direction V illustrated in FIGS. 2 and 5 at a feed rate v against the cutting disk 2 which for its part is rotating about its axis of rotation in the direction A illustrated in FIG. 1. The rotating cutting disk 2 bites into the single crystal 1 to cut off a section 1a, which will later form the wafer, from the single crystal 1. In the cutting operation, after reaching a critical depth of penetration into the single crystal 1 the diamond particles in the cutting edge 3 of the cutting disk 2 produce microcracks which due to reciprocal reticulation result in abrasion of material. This critical depth of penetration depends on the direction of motion of the particles relative to the specified crystallographic orientation K. Viewed at the macroscopic level the critical depth of penetration depends on the angle ρ subtended between the specified crystallographic orientation K and the direction of advancement V in a plane at right angles to the central longitudinal axis M of the single crystal. It has been found that the critical depth of penetration differs on each of the opposite sides S, S' of the engaged cutting disk 2. FIG. 7 shows the critical depth of penetration on the opposite front side S and rear side S' of the cutting disk 2 illustrated in FIG. 5 for various settings of the angle ρ of the specified crystallographic orientation K relative to the direction of advancement V. This difference in penetration depth on the front side S and rear side S' relative to the cutting disk 2 results in different critical loads $L_x^-$ for the front side S and $L_x^+$ for the rear side S'. Thus the cutting edge 3 is exposed to different compulsive forces $F_x^-$, $F_x^+$ from the front side S and the rear side S' in addition to the compulsive force $F_z$ acting in the direction of advancement when it encounters the material of the single crystal 1 as shown in FIG. 6. These directionally dependent forces $F_x^-$, $F_x^+$ of different magnitude give rise to a resultant force F which causes a directionally dependent transverse deflection X.

Figure 8:
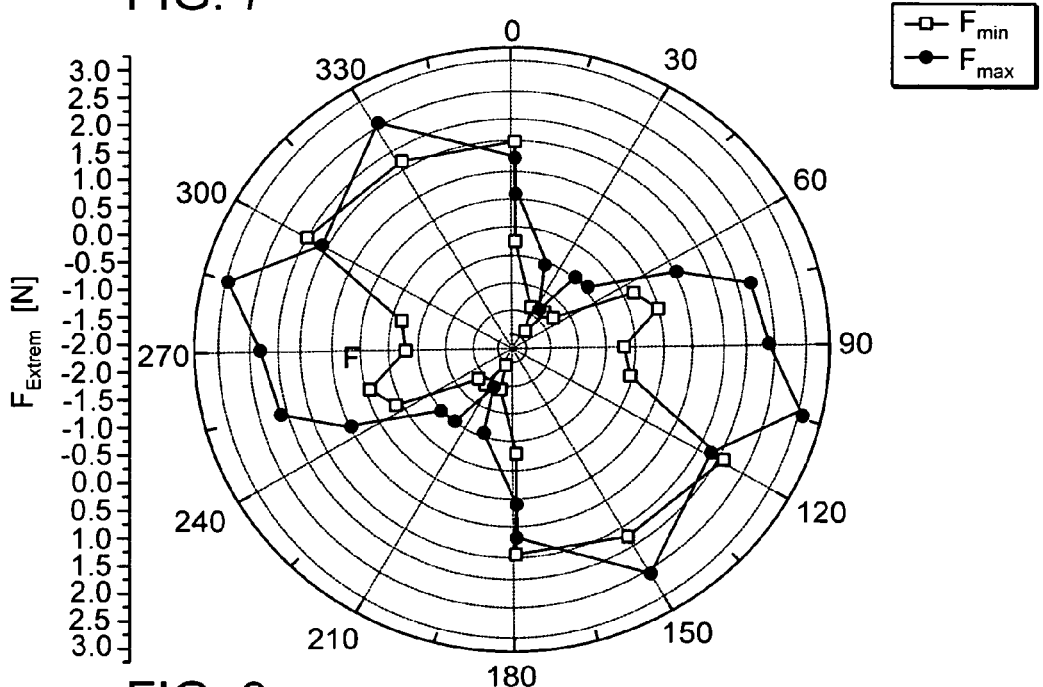
FIG. 8 an illustration of the extreme values of the resultant force of the axial compulsive force components which results in transverse deflection of a cutting tool as a function of the direction of advancement of the cutting tool during cutting of a GaAs single crystal by means of inner hole sawing.

As shown in FIG. 8 the resultant force F produced by the sum of the forces $F_x^-$, $F_x^+$ and $F_z$ is dependent on the direction of advancement V relative to the specified crystallographic orientation K, ie the angle ρ which these two directions subtend between themselves in the cutting plane at right angles to the central longitudinal axis of the single crystal 1. Depending on the material of the single crystal, or in the case of semiconductors on the doping also, and on other factors there are preferred angles at which the aforesaid compulsive forces balance out and the cutting disk 2 penetrates into the single crystal 1 without transverse deflection.

In the method according to the invention the aforesaid compulsive forces are used for correcting the transverse deflection X of the cutting disk during cutting. For this purpose, as shown in FIG. 2, the deflection X of the cutting disk or the axial cutting force component $F_a$ or $F_b$ is measured by means of the sensor 6. Depending on the value measured, the device 5 for turning the single crystal 1 is actuated via the control device 7 in such a way that the angle ρ between the specified crystallographic orientation K and the feed direction V is set so that the transverse deflection due to the compulsive forces $F_x^-$, $F_x^+$ is adjusted substantially to zero. In certain cases it is also advantageous to deflect the cutting disk or the cutting tool slightly in defined manner. This is also done by adjusting the angle ρ.

This method can be applied just as well to the wire cutting device shown in FIGS. 3 and 4, the deflection of one or more wires then being measured in this case.

Figure 9:
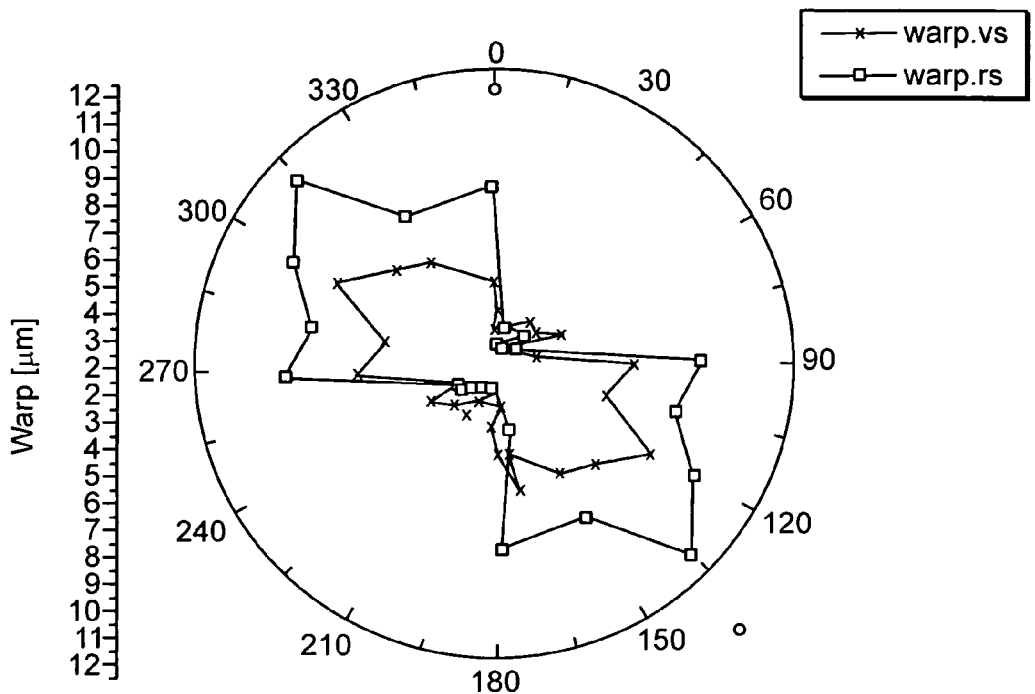
FIG. 9 an illustration of the warp of the wafer as a function of the setting of a specified crystal orientation relative to a direction of advancement of the cutting tool with reference to the example of GaAs by means of inner hole sawing.
Figure 10:
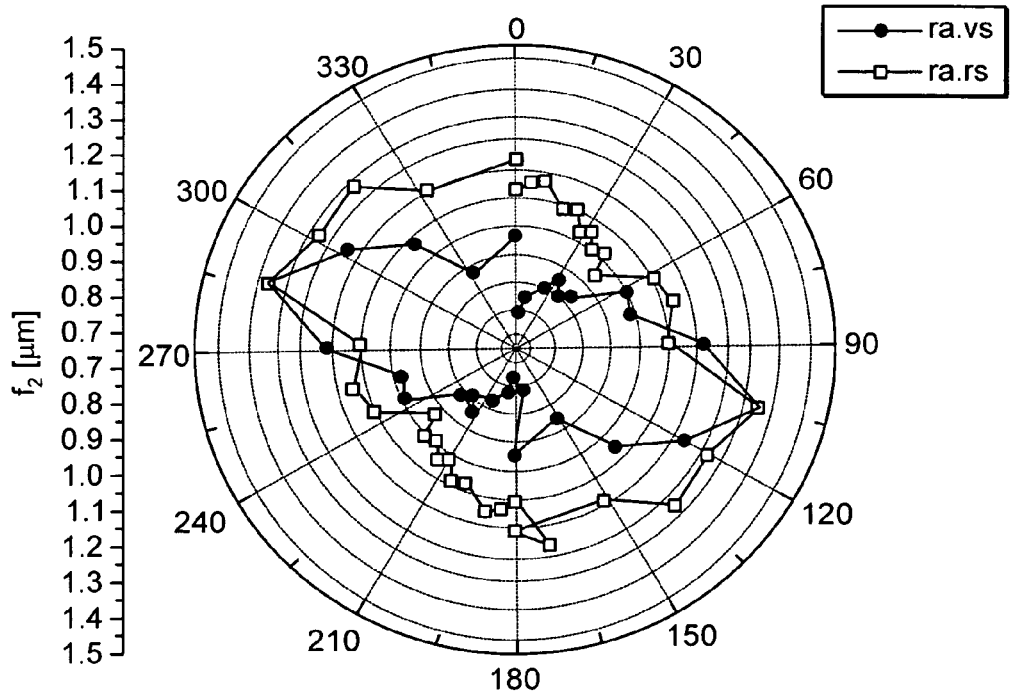
FIG. 10 an illustration of the roughness of the wafer as a function of the setting of the specified crystal orientation relative to a direction of advancement of the cutting tool with reference to the example of GaAs.

The result is, as shown in FIGS. 9 and 10, through the use of the compulsive forces for the active control of the transverse deflection a correction of the warp and roughness ra is obtained by turning the single crystal about its central longitudinal axis M to set a certain angle ρ between the specified crystallographic orientation K and the feed direction V.

Figure 11:
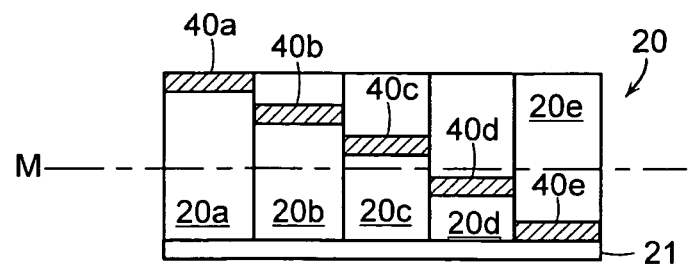
FIG. 11 a schematic illustration of a step in the test method according to the invention for the determination of the optimum angle of the specified crystal orientation relative to the direction of advancement of the cutting tool for wire cutting.

The preferred angles of the specified crystallographic orientation K relative to the direction of advancement V at which the deflection of the cutting tool during cutting becomes zero are dependent on the material of the single crystal. These angles are determined empirically for each material by means of a test procedure. In doing so, as shown in FIG. 11, a single crystal 20 of a particular material is cut into a plurality of slices 20a to 20e whose thickness is a multiple of the thicknesses of the wafers to be produced subsequently. The disks are then pasted onto a mounting 21 in such a way that their flat outer face sections (flats) 40a to 40e, eg in a wire cutting device are each arranged at different angles to the direction of advancement V. The single crystal 20 made up in this way of the disks 20a to 20e is then cut simultaneously in the cutting device into individual wafers and the wafer surfaces of the wafers obtained in this way are examined for roughness and warp. The method is repeated often enough for the preferred angles for optimum cutting to be determined. The angles determined in this way serve as the starting variable for the cutting operation for single crystals to be divided later in the devices shown in FIGS. 1 to 4, readjustment of the setting of the angle via the device 5 and the control device 7 serving for correction during the cutting operation.

Figure 12:
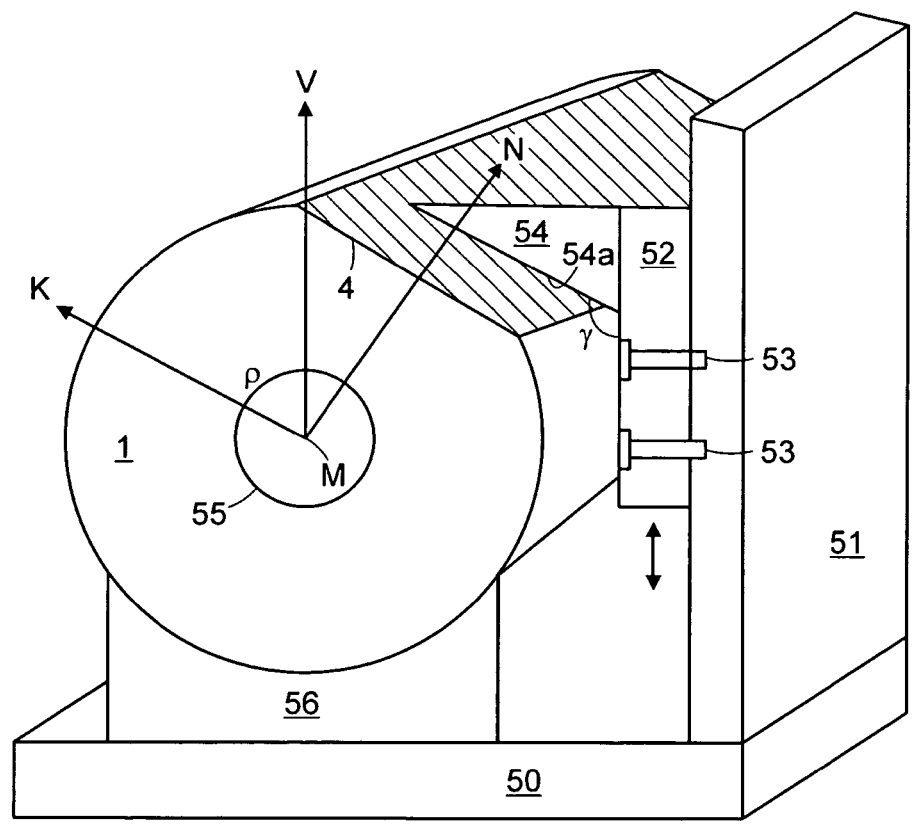
FIG. 12 a schematic illustration in perspective of the device for adjusting the single crystal.

For insertion of the single crystal 1 at a specified angle ρ between the specified crystallographic orientation K and the feed direction V into the devices shown in FIGS. 1 to 4, the adjusting device illustrated in FIG. 12 is provided. The adjusting device has a base plate 50 and a support 51 extending vertically upwards from the latter. Provided on the support 51 is a slide 52 which is displaceable up and down in the vertical direction on a rail, for example, which is not shown and can be locked at a predetermined height by means of a fastening device 53. The slide 52 has a lug 54 in the shape of an angle whose lower edge 54a subtends a predetermined angle γ with the vertical plane. For adjustment the single crystal 1, which is rigidly connected to a connecting piece 55 for inserting the single crystal into one of the cutting devices shown in FIGS. 1 to 4, is glued to a batten 56, made of graphite for example, the glue used being an adhesive which hardens only after a predetermined time so that the single crystal 1 can still be turned about its central longitudinal axis M for a certain length of time. The single crystal 1 together with the connecting piece 55 and the batten 56 is then introduced into the adjusting device, the slide 52 being fixed in advance at the height necessary for this type of single crystal. By pushing the single crystal 1 together with the connecting piece 55 and the batten 56 under the angle piece 54 the single crystal 1 is adjusted in such a way that its flat outer section 4 rests against the lower edge 54a of the angular lug 54. In doing this the angle γ which the lower edge 54a of the lug 54 forms relative to the vertical is chosen in such a way that for this specific single crystal 1 a certain preferred angle ρ is set between the specified crystallographic orientation K relative to the vertical. After the single crystal 1. Once the single crystal 1 is firmly fixed to the batten 56 it is inserted in the device for cutting. The direction of advancement V coincides with the vertical so that the angle ρ is defined.

The invention described above exhibits the special advantage that using it in particular GaAs wafers having a diameter of six inches or possibly more can still be cut without difficulty by inner hole sawing because an increased rate of advancement is possible.

The invention is not limited to the cutting of semiconductor single crystals (pure elements, semiconductors, semiconducting compounds). On the contrary the method according to the invention and the device can be employed for cutting any single crystals such as optical single crystals or ceramics.

The invention claimed is:

1. A method for the division of a single crystal material with a cutting tool of a cutting device, the method comprising:

orienting the single crystal material in the cutting device such that a specified crystallographic orientation (K) lies in the cutting plane (T);

positioning the single crystal in the cutting device so that an angle (ρ) between the specified crystallographic orientation (K) and a direction of advancement (V) of the cutting through the single crystal material is formed such that forces acting on the cutting tool during cutting in a direction at right angles to the cutting plane (T) compensate one another or add up to a predetermined force;

cutting the single crystal material in the cutting device by moving the cutting tool relative to the single crystal material in the direction of advancement (V);

measuring a deflection (X) of the cutting tool during the cutting; and turning the single crystal as a function of the measured value with the specified crystallographic orientation (K) in the cutting plane (T).

2. A method according to claim 1, wherein the cutting is done by means of inner hole sawing.

3. A method according to claim 1, wherein the cutting is done by means of wire cutting.

4. A method according to claim 1, wherein the selecting step comprises determining the angle (ρ) empirically prior to cutting.

5. A method according to claim 1, further comprising setting of the angle (ρ) by means of an adjusting device outside the cutting device.

6. A method according to claim 1, wherein III-V semiconductor single crystals are cut.

7. A method according to claim 1, wherein GaAs single crystals are cut.

8. A method for the division of a single crystal material with a cutting tool of a cutting device, the method comprising:

orienting the single crystal material in the cutting device such that a specified crystallographic orientation (K) lies in the cutting plane (T);

positioning the single crystal in the cutting device so that an angle (ρ) between the specified crystallographic orientation (K) and a direction of advancement (V) of the cutting through the single crystal material is formed such that forces acting on the cutting tool during cutting in a direction at right angles to the cutting plane (T) compensate one another or add up to a predetermined force; and cutting the single crystal material in the cutting device by moving the cutting tool relative to the single crystal material in the direction of advancement (V);

wherein the selecting step comprises determining the angle (ρ) empirically prior to cutting, wherein the selecting step comprises a test method for the determination of the optimum angle between the specified crystallographic orientation (K) and the direction of advancement (V) of cutting through the single crystal material such that forces acting on the cutting tool during cutting in a direction at right angles to the cutting plane (T) compensate one another or add up to a predetermined force, wherein a single crystal of the single crystal material is substantially cylindrical with a central longitudinal axis (M) and the single crystal has an external characteristic whose orientation relative to a specified crystallographic orientation (K) of the single crystal is known, said test method comprising:

dividing the single crystal into a plurality of sections of predetermined thickness at right angles to the central longitudinal axis of the crystal;

joining of the sections in such a way that the external characteristic of each section assumes a different azimuthal position relative to the central longitudinal axis;

in a cutting device, simultaneously cutting the single crystal joined in this way into a plurality of disks having the desired thickness of a wafer to be produced;

measuring the surface evenness and/or thickness of the disks produced in this way; and determining the optimum angle ($\rho$) of the specified crystallographic orientation (K) relative to a direction of advancement (V) of the cutting tool.

9. The test method according to claim 8, wherein the external characteristic is a flat or a notch.

* * * * *